United States Patent
Pappalardo et al.

(10) Patent No.: US 7,224,206 B2
(45) Date of Patent: May 29, 2007

(54) CHARGE-PUMP WITH IMPROVED BIASING OF THE BODY REGIONS OF THE PASS-TRANSISTORS

(75) Inventors: Domenico Pappalardo, Gravina Di Catania (IT); Carmelo Ucciardello, Catania (IT); Gaetano Palumbo, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 106 days.

(21) Appl. No.: 11/066,105

(22) Filed: Feb. 24, 2005

(65) Prior Publication Data

US 2005/0200399 A1    Sep. 15, 2005

(30) Foreign Application Priority Data

Feb. 24, 2004    (IT) .............................. MI04A0309

(51) Int. Cl.
*G05F 1/10* (2006.01)
(52) U.S. Cl. ...................... 327/536; 327/390; 327/589; 327/148; 327/157; 363/59; 363/60
(58) Field of Classification Search .................... None
See application file for complete search history.

(56) References Cited

U.S. PATENT DOCUMENTS

| | | | | |
|---|---|---|---|---|
| 5,767,733 A | * | 6/1998 | Grugett | 327/534 |
| 6,130,574 A | * | 10/2000 | Bloch et al. | 327/536 |
| 6,377,112 B1 | * | 4/2002 | Rozsypal | 327/534 |
| 6,448,841 B1 | * | 9/2002 | Milazzo | 327/536 |
| 6,677,806 B2 | * | 1/2004 | Bloch | 327/536 |
| 6,700,435 B2 | * | 3/2004 | Becker | 327/536 |
| 6,878,981 B2 | * | 4/2005 | Eshel | 257/299 |
| 6,965,263 B2 | * | 11/2005 | Bringivijayaraghavan | 327/537 |

* cited by examiner

*Primary Examiner*—Tuan T. Lam
*Assistant Examiner*—Hiep Nguyen
(74) *Attorney, Agent, or Firm*—Lisa K. Jorgenson; Robert Iannucci; Seed IP Law Group PLLC

(57) ABSTRACT

A charge pump is proposed. The charge pump is integrated in a chip of semiconductor material and includes a plurality of capacitive elements each one connected to a corresponding circuit node of the charge pump, the circuit nodes being arranged in a sequence from an input node to an output node, a plurality of field effect transistors each one for selectively connecting a corresponding first circuit node with a second adjacent circuit node, each transistor being made in a corresponding insulated body region, and for each transistor first biasing means for equalizing the body region with the first circuit node when the transistor is closed, wherein for each transistor the charge pump further includes second biasing means for equalizing the body region with the second circuit node when the transistor is opened.

23 Claims, 3 Drawing Sheets

CHARGE-PUMP WITH IMPROVED BIASING OF THE BODY REGIONS OF THE PASS-TRANSISTORS

BACKGROUND OF THE INVENTION

1. Field of the Invention

The present invention relates to a charge pump for an integrated circuit.

2. Description of the Related Art

A charge pump is a particular voltage booster circuit, which is used for generating a voltage higher than its power supply voltage. The charge pumps commonly find application in an integrated circuit, for example, comprising a semiconductor non-volatile memory. In fact, the non-volatile memory requires the application of different voltages according to the operation that must be performed (for example, a high voltage is required for its programming and erasing). In order to avoid using a power supply voltage of high value, the integrated circuit includes one or more charge pumps that generate each required voltage from a power supply voltage of lower value.

Operation of a charge pump is based on the continuous accumulation and transfer of electric charge in a series of circuit stages (made by capacitors), which are cascade-connected. In such a way, the voltage at the capacitors increases from an input terminal (that receives the power supply voltage) to an output terminal (that provides the desired voltage). The stages of the charge pump are selectively connected to each other through electronic switches; generally, these switches are implemented by pass-transistors, for example, of the nMOS or pMOS type.

The pass-transistors can be made by forming the various source and drain regions directly in a common substrate of a chip of semiconductor material in which the non-volatile memory is integrated. However, this structure suffers of a body effect. In fact, the substrate must be maintained at a voltage ensuring that the stray diodes formed with the source/drain regions of the first (or of the last) pass-transistor are reverse biased. Consequently, the reverse voltage between the substrate and the source/drain regions of the next (or preceding) pass-transistors will be higher; this involves an increase of the extension of the corresponding depletion region (and therefore of the junction electric field), so that a higher gate voltage will be necessary to obtain the conduction in the respective channel.

The corresponding increase of the threshold voltage of the pass-transistors requires the use of larger components, so as not to degrade their switching efficiency. In any case, this limits the maximum number of stages that can be used for implementing the charge pump.

In order to avoid such problem, it is preferable to make each pass-transistor in a corresponding body region; the body region is insulated from the common substrate directly (if of a different type) or by a further intermediate region otherwise (with a structure known as triple-well). This allows applying power supply voltages of different values to the body regions of the various pass-transistors.

Several biasing circuits of body regions have been proposed for this purpose, so as to remove (or at least reduce) the body effect in the pass-transistors of the charge pump.

For example, document U.S. Pat. No. 6,026,003 proposes using a secondary charge pump for each pass-transistor; the secondary charge pump (which uses diodes as switches) is fed by the voltage that is output by the respective stage. Nevertheless, such structure is rather complex; besides, it is not able to remove the body effect completely (because a reverse voltage different from zero is in any case applied between the body region and the source/drain regions).

A different solution is described in document US-A-2003/0034826. The proposed structure consists of two charge pumps in parallel, which work out-of-phase. Each switch consists of two pass-transistors in series; the intermediate nodes of the two pairs of pass-transistors of each stage are short-circuited to each other. In this structure, each pass-transistor is controlled by the voltage at the adjacent capacitor of the other charge pump. An auxiliary transistor is associated with the first pass-transistor of each charge pump. The body regions of the first pass-transistors of the two charge pumps and of the respective auxiliary transistors are short-circuited to each other. When a generic pair of pass transistors is closed, the corresponding auxiliary transistor equalizes the body region of the first pass-transistor with the voltage at the respective capacitor. At the same time, the pair of pass-transistors in the other charge pump is opened; the intermediate node of such pair of pass-transistors is however maintained at a correct voltage by means of the short-circuit with the intermediate node of the pair of pass-transistors of the other charge pump.

A drawback of the above described structure is that the proposed architecture is not very flexible and it is strictly dependent on the control method of the pass-transistors that is used. Besides, such solution requires the implementation of each switch by two pass-transistors; in fact, the short-circuit between the intermediate nodes of the two pairs of pass-transistors of each stage must be insulated from the next stage (when the first pass-transistors are opened) in order not to interfere with the operation of the charge pump.

BRIEF SUMMARY OF THE INVENTION

One embodiment of the present invention overcomes the above-mentioned drawbacks using a charge pump.

Shortly, an embodiment of the present invention provides a charge pump integrated in a chip of semiconductor material and including a plurality of capacitive elements each one connected to a corresponding circuit node of the charge pump, the circuit nodes being arranged in a sequence from an input node to an output node, a plurality of field effect transistors each one for selectively connecting a corresponding first circuit node with a second adjacent circuit node, each transistor being made in a corresponding insulated well region, and for each transistor first biasing means for equalizing the well region with the first circuit node when the transistor is closed, wherein for each transistor the charge pump further includes second biasing means for equalizing the well region with the second circuit node when the transistor is opened.

Besides, an embodiment of the present invention also proposes a non-volatile memory device including such charge pump and a corresponding method for operating a charge pump.

BRIEF DESCRIPTION OF THE SEVERAL VIEWS OF THE DRAWINGS

The features and the advantages of the solution according to the present invention will be made clear by the following description of preferred embodiments thereof, given purely by way of a non-restrictive indication, with reference to the attached figures, in which.

DETAILED DESCRIPTION OF THE INVENTION

Figure 1:
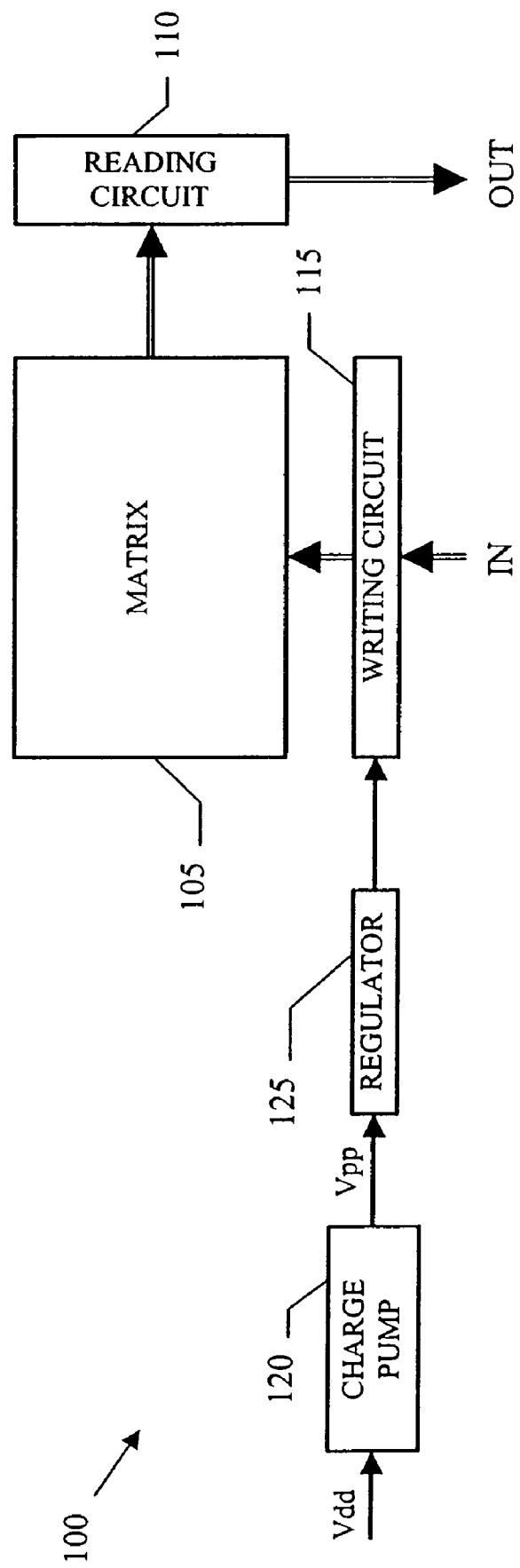
FIG. 1 is a schematic block-diagram of a non-volatile memory device in which the charge pump of an embodiment of the invention can be used.

With reference in particular to FIG. 1, a schematic block-diagram of a non-volatile memory device 100 is illustrated. The non-volatile memory 100, for example a flash $E^2PROM$, is integrated in a chip of semiconductor material. The flash memory 100 includes a matrix 105 of memory cells (with respective column and row decoders).

A reading circuit 110 (typically formed by a bank of sense amplifier), is used for reading the values stored in a set of selected memory cells. A writing circuit 115 (typically formed by a bank of program loads) is instead used for programming the selected memory cells.

One or more charge pumps 120 receive a power supply voltage Vdd (for example, 2V with respect to a reference voltage or ground); the charge pumps 120 output a series of over-boosted voltages of various value (for example, up to ±9V), denoted as a whole with Vpp. Each over-boosted voltage Vpp is fed to a regulator 125, which substantially maintains the over-boosted voltage Vpp steady for changing load conditions; the regulator 125 directly feeds the program loads 115.

In any case, the concepts of the present invention are also applicable when the memory device has an equivalent architecture or is of a different type (such as an $E^2PROM$). Alternatively, the memory device is supplied by another voltage, or the charge pumps output over-boosted voltages of different values.

Figure 2:
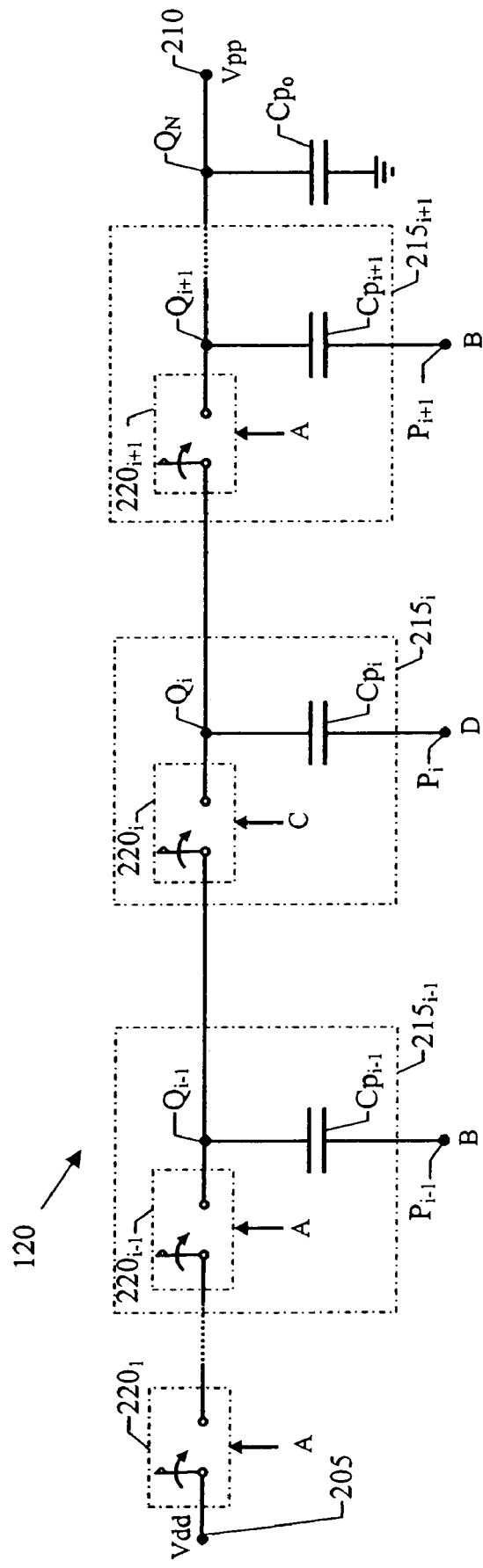
FIG. 2 shows a simplified circuit scheme of the charge pump.

Considering now FIG. 2, a simplified circuit scheme of the charge pump 120 is shown. The charge pump 120 includes a number N (for example, 8) of circuit stages $215_i$ (with i=1 ... N). The stages $215i$ are cascade-connected from an input terminal 205 (that receives the power supply voltage Vdd) to an output terminal 210 (that outputs the over-boosted voltage Vpp).

Each stage $215_i$ includes a capacitor $Cp_i$ having a relatively high capacitance (such as 1–10 pF) and an electronic switch $220_i$. A plate of the capacitor $Cp_i$ is connected to a first terminal of the switch $220_i$, which defines a circuit node $Q_i$. A second terminal of the switch $220_i$ is connected to the circuit node $Q_{i-1}$ of the preceding stage $215_{i-1}$ (the second terminal of the switch $220_i$ is connected to the input terminal 205). The last circuit node $Q_N$ is connected to the output terminal 210; an output capacitor $Cp_O$ is further connected between the output terminal 210 and a ground terminal.

Two command signals A and C are used for controlling the switches $220_1$–$220_N$. The command signals A and C are alternatively applied to each pair of adjacent switches $220_1$–$220_N$; for example, the command signal C is applied to a generic switch $220_i$, while the command signal A is applied to the two adjacent switches $220_{i-1}$ and $220_{i+1}$. The command signals A and C are periodic signals being out-of-phase, which switch with a high frequency f (typically of some tens of MHz) between an opening voltage and a closing voltage of the corresponding switches $220_1$–$220_N$.

Two further command signals B and D are used for controlling the capacitors $Cp_i$. The command signals B and D are alternatively applied to each pair of adjacent capacitors $CP_1$–$CP_N$; for example, the command signal D is applied to a terminal $P_i$ connected to the free plate of the capacitor $Cp_i$, while the command signal B is applied to the terminals $P_{i-1}$ and $P_{i+1}$ connected to the respective free plates of the adjacent capacitors $Cp_{i-1}$ and $Cp_{i+1}$. Also the command signals B and D are periodic signals out-of-phase, which switch between a low voltage (for example, 0V) and a high voltage (for example, Vdd) with the frequency f.

In order to describe operation of the charge pump 120, at first let us consider an ideal condition (no-load). Initially, the switch $220_1$ is closed by the command signal A, while the switch $220_2$ is opened by the command signal C; at the same time, the terminal $P_1$ is maintained at the voltage 0V by the command signal B (while the command signal D is at the voltage Vdd). In such condition, the capacitor $Cp_1$ is charged to the voltage Vdd, and therefore a voltage $Vq_1$ at the circuit node $Q_1$ is brought to the voltage Vdd. When the command signals A–D change, the switch $220_1$ is opened, while the switch $220_2$ is closed; at the same time, the terminal $P_1$ is brought to the voltage Vdd, while the terminal $P_2$ is brought to the voltage 0V. Consequently, the node $Q_1$ immediately goes to the voltage $Vq_1$=Vdd+Vdd=2 Vdd and therefore the capacitor $Cp_2$ is charged to the same voltage. Likewise, the capacitor $Cp_3$ is charged to the voltage 3Vdd, and so on up to the capacitor $CP_N$ (and then the output capacitor $Cp_O$ as well) that is charged to the voltage N Vdd.

In a real condition, a load connected to the output terminal 210 absorbs electric charge from the output capacitor $Cp_O$ (and from the capacitor $CP_N$); consequently, (with the switch $220_N$ opened) a voltage $Vq_N$ at the circuit node $Q_N$ will be lower than the ideal value N Vdd. When the switch $220_N$ is closed, the capacitor $CP_N$ (and the output capacitor $Cp_O$) is therefore charged to the voltage N Vdd by the capacitor $CP_{N-1}$. Likewise, the capacitor $CP_{N-2}$ is recharged by the capacitor $CP_{N-3}$, and so on up to the capacitor $Cp_1$ that is recharged to the power supply voltage Vdd.

Therefore, when a generic switch $220_i$ is closed, the voltage $Vq_{i-1}$ (Vdd+(i-1)Vdd=i Vdd) at the circuit node $Q_{i-1}$ in general will be initially higher than the voltage $Vq_i$ (<i Vdd) at the circuit node $Q_i$; therefore, the two voltages $Vq_{i-1}$ and $Vq_i$ will be brought to the same value following the recharge of the capacitor $Cp_i$ by the capacitor $Cp_{i-1}$. Conversely, when the switch $220_i$ is opened the voltage $Vq_{i-1}$ (0+(i+-1) Vdd=(i-1) Vdd) will be initially lower than the voltage $Vq_i$ (Vdd+i Vdd=(i+1) Vdd); nevertheless, when the load connected to the output node 210 has a high capacitance, it is possible that the discharge of the capacitor $Cp_i$ (and the simultaneous recharge of the capacitor $Cp_{i-1}$) should brought the voltage $Vq_i$ to a value lower than the value of the voltage $Vq_{i-1}$.

In any case, the concepts of the present invention are also applicable when the charge pump has another structure or comprises a different number of stages. Similar considerations apply if the charge pump uses other voltages, different command signals or equivalent capacitive elements.

Figure 3:
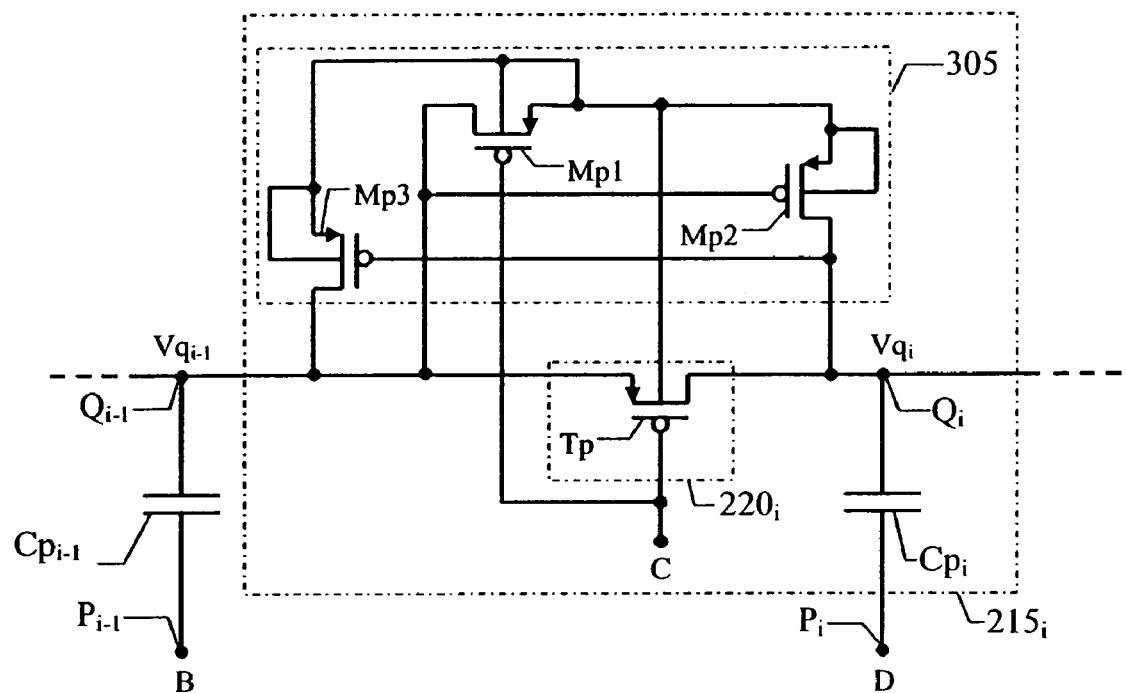
FIG. 3 shows a stage of the charge pump in detail according to an embodiment of the present invention.

Considering now FIG. 3, a generic stage $215_i$ of the charge pump according to an embodiment of the present invention is illustrated in detail.

The switch $220_i$ of the stage $215_i$ is implemented by a pass-transistor pMOS Tp. The source and drain regions (of the P type) of the pass-transistor Tp are made in a corresponding body region (of the N type); in this way, the various body regions are insulated from a common substrate of the chip (of the P type), which is maintained for this purpose to the lowest available voltage in the chip.

The pass-transistor Tp has the source terminal connected to the circuit node $Q_{i-1}$ and the drain terminal connected to the circuit node $Q_i$. The command signal C is applied to the gate terminal of the pass-transistor Tp and it switches between the opening voltage (equal to the maximum voltage at the circuit node $Q_i$) and the closing voltage (equal to such voltage minus Vdd).

The stage $215_i$ further includes a biasing circuit 305 for maintaining the body region of the pass-transistor Tp to a suitable voltage. The biasing circuit 305 consists of three further pMOS transistors Mp1, Mp2 and Mp3, which are formed in the same body region as the pass-transistor Tp (so that the corresponding body terminals are short-circuited to each other).

The transistors Mp1, Mp2 and Mp3 have the source terminals short-circuited with the respective body terminals. The transistors Mp1 and Mp3 have the drain terminals connected to the source terminal of the pass-transistor Tp (circuit node $Q_{i-1}$), while the transistor Mp2 has the drain terminal connected to the drain terminal of the pass-transistor Tp (circuit node $Q_i$). The pass-transistor Tp and the transistor Mp1 have the respective gate terminals connected to each other (so that the transistor Mp1 as well is controlled by the command signal C). Instead, the transistors Mp2 and Mp3 have the gate terminals connected to the drain terminal (circuit node $Q_i$) and to the source terminal (circuit node $Q_{i-1}$), respectively, of the pass-transistor Tp.

During operation of the charge pump, when the pass-transistor Tp is maintained turned on by the command signal C at the closing voltage (with the command signal B at the voltage Vdd and the command signal D at the voltage 0V), the voltage $Vq_{i-1}$ at the source terminal of the pass-transistor Tp is initially higher than the voltage $Vq_i$ at its drain terminal.

In this condition, also the transistor Mp1 is turned on, because the command signal C at its gate terminal is at the closing voltage and the voltage at its source terminal is at a higher value, as will be evident in the following. The transistor Mp1 being turned on brings the high voltage $Vq_{i-1}$ to the source terminals of the transistors Mp1–Mp3, and to the body terminals of the pass-transistor Tp and of the transistors M1p–M3p. The transistor Mp3 is initially turned on, since the low voltage $Vq_i$ at its gate terminal is lower than the high voltage $Vq_{i-1}$ at its source terminal; the transistor Mp3 turns off when the voltage between the source and gate terminals reaches its threshold voltage (following the charge of the capacitor $Cp_i$). The transistor Mp2 is instead turned off, since its source and gate terminals are both at the same high voltage $Vq_{i-1}$. Consequently, the voltage at the body terminal of the pass-transistor Tp is equal to the voltage at its source terminal (and higher than the voltage at its drain terminal). At the same time, the voltage at the body (and source) terminals of the transistors Mp1–Mp3 is higher than or equal to the voltage at the respective drain terminals.

Conversely, when the pass-transistor Tp is turned off by the command signal C that switches to the opening voltage (with the command signal B that switches to the voltage 0V and the command signal D that switches to the voltage Vdd), the voltage $Vq_{i-1}$ is lower than the voltage $Vq_i$.

In this condition, also the transistor Mp1 is turned off, since the command signal C at its gate terminal is at the opening voltage and the voltage at its source terminal is at a lower value. Conversely, the transistor Mp2 is turned on, since the low voltage $Vq_{i-1}$ at the gate terminal is lower than the voltage at its source terminal. The transistor Mp2 being turned on brings the high voltage $Vq_i$ to the source terminals of the transistors Mp1–Mp3, and to the body terminals of the pass-transistor Tp and of the transistors Mp1–Mp3. The transistor Mp3 is turned off, since its gate and source terminals are both at the same high voltage $Vq_i$. Consequently, the voltage at the body terminal of the pass-transistor Tp is equal to the voltage at its drain terminal (and greater than the voltage at its source terminal); at the same time, the voltage at the body (and source) terminals of the transistors Mp1–Mp3 is greater than or equal to the voltage at the respective drain terminals.

In the condition described above, if the output terminal of the charge pump is connected to a load with high capacitance, the voltage $Vq_i$ can go down to a value lower than the voltage $Vq_{i-1}$ following the discharge of the capacitor $Cp_i$. Consequently, the transistor Mp2 turns off because of the lowering of the voltage $Vq_i$ at its source terminal. Nevertheless, at the same time the transistor Mp3 turns on as soon as the voltage between the gate and source terminals reaches its threshold voltage. The transistor Mp3 being turned on brings the voltage (now high) $Vq_{i-1}$ to the body terminals of the pass-transistor Tp and of the transistors Mp1–Mp3.

In view of the above, the body region of each pass-transistors Tp is biased at any time to the higher between the voltages at its source terminal and at its drain terminal. Such dynamic biasing scheme allows avoiding the turning on of the stray diodes (between the body region and the drain/source regions) without introducing any body effect; this allows reducing the size of the pass-transistors (of a factor up to 5) for the same switching efficiency.

Figure 4:
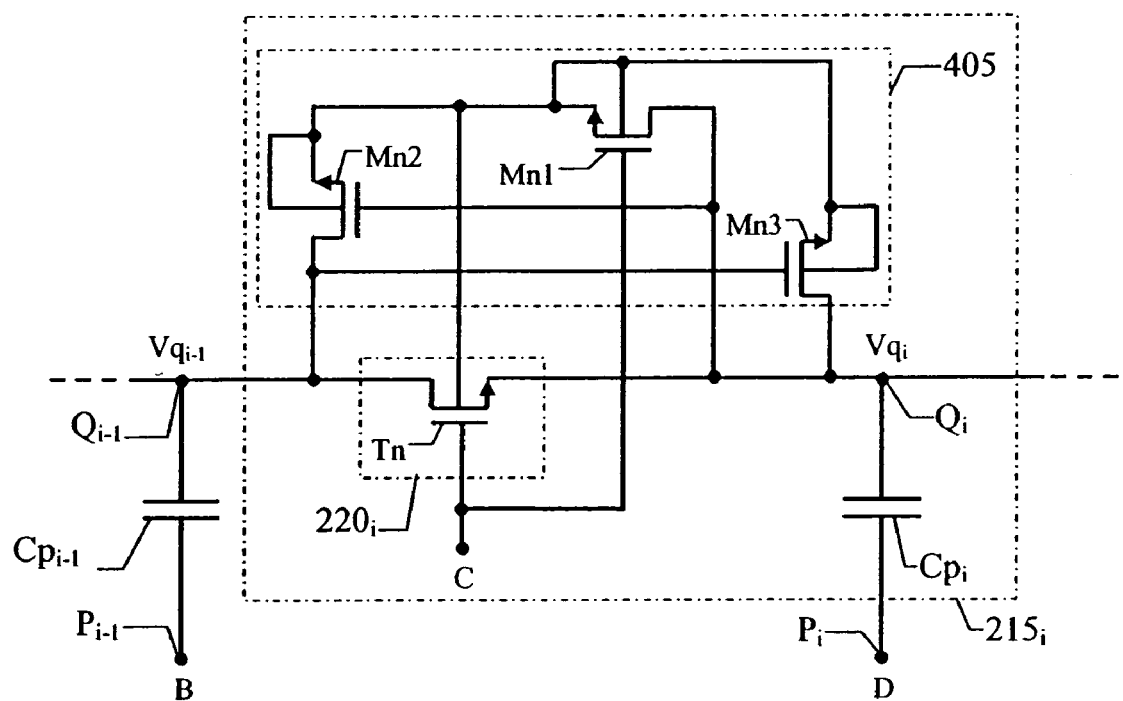
FIG. 4 shows a stage of the charge pump in detail according to a further embodiment of the present invention.

Considering now FIG. 4, a generic stage $215_i$ of the charge pump in an alternative embodiment of the present invention is illustrated in detail.

In such case, the switch $220_i$ of the stage $215_i$ is implemented by an nMOS pass-transistor Tn. The source and drain regions (of the N type) of the pass-transistor Tp are made in a corresponding body region (of the P type). The body region is in turn made in a well (of the N type), which is insulated from a common substrate of the chip (of the P type).

A biasing circuit 405 (consisting of three nMOS transistors Mn1, Mn2 and Mn3) is used for biasing the body region of the pass-transistor Tn. Such circuit is exactly the dual version of the one of FIG. 3, so that its description will be omitted for the sake of brevity. In this way, the body regions of the pass-transistors Tn are biased at any time to the lower between the voltages at its source and drain terminals.

The same structures described above are usable in a negative charge pump, simply replacing the pMOS transistors by nMOS transistors, and vice versa.

However, the concepts of the present invention are also applicable to equivalent field effect transistors (such as JFETs); besides, the various transistors can have a different structure or can be made in equivalent body regions; for example, in a chip with a substrate of the N type the body regions of the nMOS transistors are directly formed in the substrate while the body regions of the transistors pMOS are insulated by a triple-well structure.

More generally, one embodiment of the present invention proposes a charge pump that is integrated in a chip of semiconductor material. The charge pump includes a plurality of capacitive elements, each one connected to a corresponding circuit node of the charge pump; the circuit nodes are arranged in a sequence from an input node to an output node. The charge pump further includes a plurality of field effect transistors, each one for selectively connecting a corresponding first circuit node with a second adjacent circuit node; each transistor is made in a corresponding insulated body region. For each transistor, first biasing means is provided for equalizing the body region with the first circuit node when the transistor is closed. In the charge pump of the embodiment of the invention, for each transistor second biasing means is further provided for equalizing the body region with the second circuit node when the transistor is opened.

The charge pump according to the embodiment of the present invention allows maintaining the body region of each transistor at any time biased to the higher (or lower) value between the voltages at the corresponding nodes of the charge pump.

Such dynamic biasing scheme avoids turning on the stray diodes formed with the body region, without introducing any body effect (with the consequent possibility of reducing the size of the transistors for the same switching efficiency).

It is important to point out that the above-mentioned results are of general applicability. In fact, the proposed solution is completely independent of both the control scheme of the transistors and their implementation.

The preferred embodiments of the invention described above offer further advantages.

Particularly, the biasing circuit of each pass-transistor is implemented by two further transistors (one controlled by the command signal of the pass-transistor and the other controlled by the voltage at a first one of the corresponding circuit nodes of the charge pump).

The proposed structure is very simple, but at the same time effective.

Advantageously, all transistors of each stage can be made in the same body region.

This allows obtaining an extremely compact structure.

In a preferred embodiment of the invention, the biasing circuit is implemented according to the scheme described above.

Such solution results particularly simple.

In any case, the proposed solution is also applicable to biasing circuits based on different field effect transistors, even made in distinct body regions; besides, the biasing circuit can have a different structure or can be made by other components (such as BJT transistors).

Advantageously, the biasing circuit may include a further transistor controlled by the voltage at a second one of the corresponding circuit nodes of the charge pump.

This additional feature avoids that the body terminal of the pass-transistor should remain floating when the charge pump is connected to a high capacitance load.

A suggested choice is also to make such further transistor in the same body region as the other transistors of the stage.

This maintains the whole structure of the charge pump simple and compact.

In a preferred embodiment of the invention, such further transistor is connected according to the scheme described above.

Such solution results particularly simple.

Alternatively, the further transistor is made with other components or in a distinct body region; in any case, the biasing circuit can have a different structure or can even be made without such further transistor.

The charge pump according the embodiment of the present invention finds application in a non-volatile memory device.

However, the use of the charge pump in different devices having a limited power supply voltage (such as displays, processors, and similar) is contemplated.

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A charge pump integrated in a chip of semiconductor material comprising:
   a plurality of capacitive elements each one connected respectively to a corresponding circuit node of a plurality of circuit nodes of the charge pump, the circuit nodes being arranged in a sequence from an input node to an output node;
   a plurality of field effect transistors each one for selectively connecting a corresponding first one of circuit nodes with an adjacent second one of the circuit nodes, each transistor being made in a corresponding insulated body region;
   a plurality of first biasing means each corresponding respectively to one of the transistors, each first biasing means equalizing the body region of the corresponding transistor with the corresponding first circuit node when the corresponding transistor is closed; and
   a plurality of second biasing means each corresponding respectively to one of the transistors, each second biasing means equalizing the body region of the corresponding transistor with the corresponding second circuit node when the corresponding transistor is opened, wherein each transistor is controlled by a corresponding command signal, and wherein each first biasing means includes a first further transistor for selectively connecting the body region of the corresponding field effect transistor with the corresponding first circuit node, the first further transistor being controlled by the command signal, and wherein each second biasing means includes a second further transistor for selectively connecting the body region of the corresponding field effect transistor with the corresponding second circuit node, the second further transistor being controlled by a voltage at the corresponding first circuit node.

2. The charge pump according to claim 1 wherein the first further transistor and the second further transistor are formed in the body region of the corresponding field effect transistor.

3. The charge pump according to claim 2 wherein each field effect transistor has a first terminal connected to the corresponding first circuit node, a second terminal connected to the corresponding second circuit node and a control terminal for receiving the command signal, wherein the corresponding first further transistor has a first terminal connected to the corresponding body region, a second terminal connected to the corresponding first circuit node and a control terminal for receiving the command signal, and wherein the corresponding second further transistor has a first terminal connected to the body region, a second terminal connected to the corresponding second circuit node and a control terminal connected to the corresponding first circuit node.

4. The charge pump according to claim 1 wherein each second biasing means is disabled when a difference between a voltage at the corresponding first circuit node and a voltage at the corresponding second circuit node reaches a threshold value, the charge pump further including a plurality of third biasing means corresponding respectively to the field effect transistors, each third biasing means equalizing the body region with the corresponding first circuit node when the corresponding transistor is opened and the corresponding second biasing means is disabled.

5. The charge pump according to claim 4 wherein each third biasing means includes a further transistor for selectively connecting the corresponding body region with the corresponding first circuit node, the further transistor being controlled by the voltage at the corresponding second circuit node.

6. The charge pump according to claim 5 wherein the further transistor is formed in the corresponding body region.

7. The charge pump according to claim 6 wherein the further transistor has a first terminal connected to the corresponding body region, a second terminal connected to the corresponding first circuit node and a control terminal connected to the corresponding second circuit node.

8. A non-volatile memory device integrated in a chip of semiconductor material, the memory device comprising a charge pump that includes:
    a plurality of capacitive elements each one connected respectively to a corresponding circuit node of a plurality of circuit nodes of the charge pump, the circuit nodes being arranged in a sequence from an input node to an output node;
    a plurality of field effect transistors each one for selectively connecting a corresponding first one of circuit nodes with an adjacent second one of the circuit nodes, each transistor being made in a corresponding insulated body region, each corresponding first circuit node being closer than the corresponding second circuit node to the input node;
    a plurality of first biasing means each corresponding respectively to one of the transistors, each first biasing means equalizing the body region of the corresponding transistor with the corresponding first circuit node when the corresponding transistor is closed; and
    a plurality of second biasing means each corresponding respectively to one of the transistors, each second biasing means equalizing the body region of the corresponding transistor with the corresponding second circuit node when the corresponding transistor is opened.

9. The non-volatile memory device according to claim 8 wherein each transistor is further controlled by a corresponding command signal, and wherein each first biasing means includes a first further transistor for selectively connecting the body region of the corresponding field effect transistor with the first corresponding circuit node, the first further transistor being controlled by the command signal, and wherein each second biasing means includes a second further transistor for selectively connecting the body region of the corresponding field effect transistor with the corresponding second circuit node, the second further transistor being controlled by a voltage at the corresponding first circuit node.

10. The non-volatile memory device according to claim 9 wherein the first further transistor and the second further transistor are formed in the body region of the corresponding field effect transistor.

11. The non-volatile memory device according to claim 10 wherein each field effect transistor has a first terminal connected to the corresponding first circuit node, a second terminal connected to the corresponding second circuit node and a control terminal for receiving the command signal, wherein the corresponding first further transistor has a first terminal connected to the corresponding body region, a second terminal connected to the corresponding first circuit node and a control terminal for receiving the command signal, and wherein the corresponding second further transistor has a first terminal connected to the body region, a second terminal connected to the corresponding second circuit node and a control terminal connected to the corresponding first circuit node.

12. The non-volatile memory device according to claim 8 wherein each second biasing means is disabled when a difference between a voltage at the corresponding first circuit node and a voltage at the corresponding second circuit node reaches a threshold value, the charge pump further including a plurality of third biasing means corresponding respectively to the field effect transistors, each third biasing means equalizing the body region with the corresponding first circuit node when the corresponding transistor is opened and the corresponding second biasing means is disabled.

13. The non-volatile memory device according to claim 12 wherein each third biasing means includes a further transistor for selectively connecting the corresponding body region with the corresponding first circuit node, the further transistor being controlled by the voltage at the corresponding second circuit node.

14. The non-volatile memory device according to claim 13 wherein the further transistor is formed in the corresponding body region.

15. The non-volatile memory device according to claim 14 wherein the further transistor has a first terminal connected to the corresponding body region, a second terminal connected to the corresponding first circuit node and a control terminal connected to the corresponding second circuit node.

16. A method for operating a charge pump integrated in a chip of semiconductor material and including a plurality of capacitive elements each one connected to a corresponding circuit node of a plurality of circuit nodes of the charge pump, the circuit nodes being arranged in a sequence from an input node to an output node, the method comprising the steps of:
    controlling a field effect transistor for selectively connecting a first circuit node of the circuit nodes with an adjacent second circuit node of the circuit nodes, the transistor being made in an insulated body region, each corresponding first circuit node being closer than the corresponding second circuit node to the input node;
    equalizing the body region of the transistor with the first circuit node when the transistor is closed and;
    equalizing the body region of the transistor with the second circuit node when the transistor is opened.

17. The method according to claim 16, further comprising the steps of:
    opening the field effect transistor using a first command signal; and
    closing a further field effect transistor, using a second command signal, for selectively connecting the adjacent second circuit node of the circuit nodes with an adjacent third node of the circuit nodes such that the field effect transistor and the further field effect transistor are not open at the same time and the field effect transistor and the further field effect transistor are not closed at the same time.

18. The method according to claim 16, further comprising the steps of:
    applying a first command signal to a first capacitive element, the first command signal having a low-voltage state and a high-voltage state;

applying a second command signal to an adjacent second capacitive element, the second command signal having a low-voltage state and a high-voltage state;

charging the first capacitive element when the first command signal is in the low-voltage state; and charging the adjacent second capacitive element when the second command signal is in the low-voltage state.

19. A charge pump comprising:

a plurality of capacitive elements each one connected respectively to a corresponding circuit node of a plurality of circuit nodes of the charge pump, the circuit nodes being arranged in a sequence from an input node to an output node;

a plurality of pass-transistors each one for selectively connecting a corresponding first one of circuit nodes with an adjacent second one of the circuit nodes, each pass-transistor being made in a corresponding insulated body region, each corresponding first circuit node being closer than the corresponding second circuit node to the input node;

a plurality of first switches each corresponding respectively to one of the pass-transistors, each first switch coupling the body region of the corresponding pass-transistor with the corresponding first circuit node when the corresponding pass-transistor is closed; and a plurality of second switches each corresponding respectively to one of the pass-transistors, each second switch equalizing the body region of the corresponding pass-transistor with the corresponding second circuit node when the corresponding pass-transistor is opened.

20. The charge pump according to claim 19 wherein each pass-transistor is controlled by a corresponding command signal, and wherein each first switch includes a first further transistor for selectively connecting the body region of the corresponding pass-transistor with the corresponding first circuit node, the first further transistor being controlled by the command signal, and wherein each second switch includes a second further transistor for selectively connecting the body region of the corresponding pass-transistor with the corresponding second circuit node, the second further transistor being controlled by a voltage at the corresponding first circuit node.

21. The charge pump according to claim 20 wherein the first further transistor and the second further transistor are formed in the body region of the corresponding pass-transistor.

22. The charge pump according to claim 21 wherein each pass-transistor has a first terminal connected to the corresponding first circuit node, a second terminal connected to the corresponding second circuit node and a control terminal for receiving the command signal, wherein the corresponding first further transistor has a first terminal connected to the corresponding body region, a second terminal connected to the corresponding first circuit node and a control terminal for receiving the command signal, and wherein the corresponding second further transistor has a first terminal connected to the body region, a second terminal connected to the corresponding second circuit node and a control terminal connected to the corresponding first circuit node.

23. The charge pump according to claim 19 wherein each second switch is disabled when a difference between a voltage at the corresponding first circuit node and a voltage at the corresponding second circuit node reaches a threshold value, the charge pump further including a plurality of third switches corresponding respectively to the pass-transistors, each third switch coupling the body region with the corresponding first circuit node when the corresponding pass-transistor is opened and the corresponding second switch is disabled.

* * * * *